United States Patent
Wang et al.

(10) Patent No.: US 9,303,312 B2
(45) Date of Patent: Apr. 5, 2016

(54) FILM DEPOSITION APPARATUS WITH LOW PLASMA DAMAGE AND LOW PROCESSING TEMPERATURE

(71) Applicant: Areesys Technologies, Inc., Fremont, CA (US)

(72) Inventors: Kai-An Wang, Cupertino, CA (US); Craig W. Marion, San Jose, CA (US); Efrain A. Velazquez, San Jose, CA (US); Michael Z. Wong, Castro Valley, CA (US); Albert Ting, San Jose, CA (US); Jingru Sun, San Jose, CA (US)

(73) Assignee: Areesys Technologies, Inc., Fremont, CA (US)

( * ) Notice: Subject to any disclaimer, the term of this patent is extended or adjusted under 35 U.S.C. 154(b) by 179 days.

(21) Appl. No.: 14/188,689

(22) Filed: Feb. 25, 2014

(65) Prior Publication Data
US 2014/0251799 A1 Sep. 11, 2014

Related U.S. Application Data

(60) Provisional application No. 61/773,556, filed on Mar. 6, 2013.

(51) Int. Cl.
*H01J 37/34* (2006.01)
*C23C 14/35* (2006.01)

(52) U.S. Cl.
CPC ............. *C23C 14/35* (2013.01); *H01J 37/3408* (2013.01); *H01J 37/3414* (2013.01); *H01J 37/3417* (2013.01); *H01J 37/3435* (2013.01); *H01J 37/345* (2013.01)

(58) Field of Classification Search
CPC .. H01J 37/3414; H01J 37/3435; H01J 37/345
See application file for complete search history.

(56) References Cited

U.S. PATENT DOCUMENTS

| | | | | |
|---|---|---|---|---|
| 2004/0261711 A1* | 12/2004 | Choi et al. | ................ | 118/723 E |
| 2007/0187234 A1* | 8/2007 | Kadokura et al. | ....... | 204/298.02 |
| 2010/0078309 A1* | 4/2010 | Ueda et al. | ................. | 204/192.1 |
| 2011/0305912 A1* | 12/2011 | Teer et al. | ..................... | 428/457 |

* cited by examiner

*Primary Examiner* — Keith Hendricks
*Assistant Examiner* — Timon Wanga
(74) *Attorney, Agent, or Firm* — SV Patent Service

(57) ABSTRACT

A deposition system includes a magnetron sputter deposition source that includes a backing frame that includes a window and a closed loop around the window. The backing frame includes inside surfaces towards the window, one or more sputtering targets mounted on inside surfaces of the backing frame, and one or more magnets mounted on outside surfaces of the backing frame. The one or more sputtering targets include sputtering surfaces that define internal walls of the window. The one or more magnets can produce a magnetic field near the one or more sputtering surfaces. A substrate includes a deposition surface oriented towards the window in the backing frame. The deposition surface receives sputtering material(s) from the one or more sputtering targets.

20 Claims, 10 Drawing Sheets

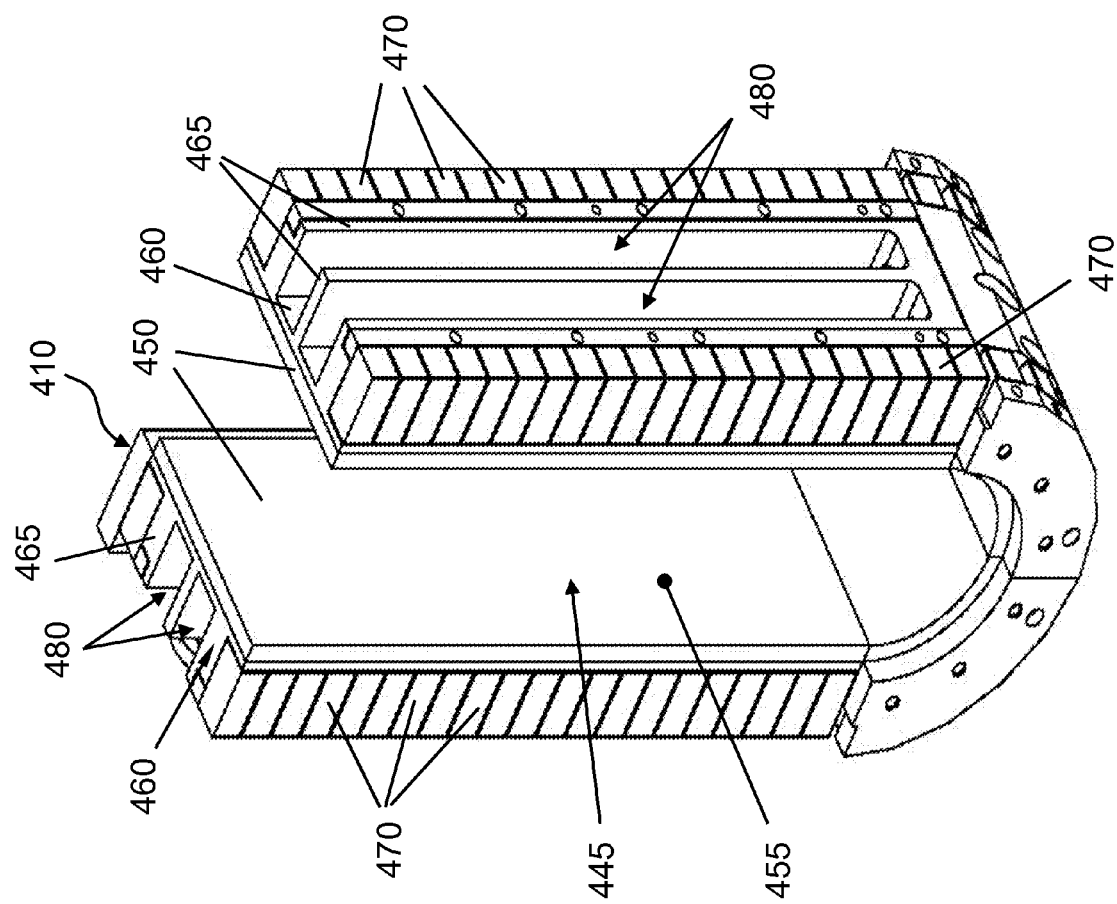

FILM DEPOSITION APPARATUS WITH LOW PLASMA DAMAGE AND LOW PROCESSING TEMPERATURE

BACKGROUND OF THE INVENTION

The present application relates to material deposition technologies, and more specifically to sputter deposition systems.

In conventional magnetron sputter deposition systems, a plasma of ions and electrons is created by direct current (DC) or radio frequency (RF) electric excitations. The plasma is confined by a magnetic field to enhance sputtering efficiency. However, energetic ions and fast electrons inside the plasma may reach a substrate to cause unwanted damages to thin films already deposited on the substrate, or to electronic devices fabricated in previous process steps. Such damages may stem from trapped electrical charges inside the deposited films and at their interfaces which can adversely impact the electronic performance of the devices. The damages may also be caused by other physical degradations or chemical decompositions of delicate materials or sensitive devices due to over-heating by fast electrons and other energetic species, atomic displacement or dislodgment (e.g., milling or sputtering) by energetic ions.

FIG. 1 illustrates a conventional magnetron sputter deposition system 100 that includes a sputtering target 120 having a sputtering surface 125. A magnetron 130 comprising magnets 140 is configured to produce a magnetic field (indicated by the magnetic field lines 127) on near the sputtering surface 125. A substrate 110 is placed in parallel to the sputtering surface 125. Since the substrate 110 is directly exposed to the plasma, the above described damages often occur to the substrate 110 during thin film deposition. For example, the encapsulation of an organic light-emitting diode (OLED) device involves depositing an oxide or nitride thin film on an OLED device already fabricated on the substrate. The above described damages can cause OLED device failure when the oxide or nitride thin film is formed by the conventional sputter deposition system 100.

There is therefore a need for an improved thin film deposition system that can eliminate or minimize damages to the films or devices on the substrate by energetic ions or fast electrons during thin film deposition.

SUMMARY OF THE INVENTION

The disclosed deposition apparatus can minimize or eliminate electronic defects produced in or at the interfaces of the devices during thin film deposition. In one example, the disclosed deposition apparatus can minimize or eliminate such damages to OLED during thin film deposition. In another example, the disclosed apparatus can minimize unwanted, uneven bombardment of fast electrons on deposited films which adversely modifies electronic properties of the deposited thin films.

The disclosed deposition apparatus can provide wider processing windows than conventional deposition systems. For example, the disclosed deposition apparatus can operate under lower processing temperatures and at the same time provide higher plasma density which allows a wider range of desired properties to be achieved in deposited thin films.

The disclosed deposition apparatus also offers size scalability to process from small to very large substrates.

Moreover, when configured in a two-sided deposition mode, the disclosed apparatus can double the throughput and materials utilization comparing to a single-sided deposition mode.

Besides sputter deposition, the disclosed apparatus is applicable to a variety of thin film deposition and plasma clean technologies where plasma enhancement is employed. Such examples include plasma enhanced chemical vapor deposition (PECVD), plasma-enhanced vapor transport deposition (PEVTD), plasma-enhanced thermal evaporation, plasma surface treatment, or combinations of these technologies.

In one general aspect, the present invention relates to a deposition system that includes: a magnetron sputter deposition source comprising a backing frame, which defines a window and a closed loop around the window, wherein the backing frame includes inside surfaces towards the window, wherein the backing frame includes outside surfaces opposite to the inside surfaces; one or more sputtering targets mounted on the inside surfaces of the backing frame, wherein the one or more sputtering targets include one or more sputtering surfaces that define internal walls of the window; and one or more magnets mounted on the outside surfaces of the backing frame, wherein the one or more magnets can produce a magnetic field near the one or more sputtering surfaces. A first substrate comprising a first deposition surface oriented towards the window in the backing frame, wherein the first deposition surface can receive sputtered material(s) from the one or more sputtering targets.

In another general aspect, the present invention relates to a deposition system that includes a magnetron sputter deposition source comprising: a backing frame that defines a window and a closed loop around the window, wherein the backing frame includes inside surfaces towards the window, wherein the backing frame includes outside surfaces opposite to the inside surfaces; one or more sputtering targets mounted on the inside surfaces of the backing frame, wherein the one or more sputtering targets include one or more sputtering surfaces that define internal walls of the window; and one or more magnets mounted on the outside surfaces of the backing frame, wherein the one or more magnets are configured to produce a magnetic field near the one or more sputtering surfaces, wherein the one or more sputtering targets are configured to provide sputtering material(s) from the one or more sputtering surfaces, wherein the sputtering material(s) are to be deposited on a first deposition surface on a first substrate, wherein the first deposition surface is oriented towards the window in the backing frame.

Implementations of the system may include one or more of the following. The first deposition surface can be substantially perpendicular to the one or more sputtering surfaces. The deposition system can further include a transport mechanism configured to produce a relative movement between the first substrate and the magnetron sputter deposition source. The deposition system can further include a second substrate positioned on the opposite side of the first substrate relative to the backing frame, wherein the second substrate comprises a second deposition surface oriented toward the window in the backing frame, wherein the second deposition surface is configured to receive sputtered material(s) from the one or more sputtering targets. The second deposition surface can be substantially perpendicular to the one or more sputtering surfaces. The backing frame can include one or more cooling channels configured to enable a coolant to flow through to carry heat away from the backing frame and the sputtering targets. The backing frame can include multiple ribs along one or more outer surfaces of the backing frame, wherein the ribs can define one or more cooling channels in between the ribs, wherein the one or more cooling channels are configured to enable a coolant to flow through to carry heat away from the backing frame and the sputtering targets. The backing frame can include multiple ribs along one or more outer surfaces of the backing frame, wherein the ribs are configured to hold the one or more magnets along the ribs. The magnets can include one or more rings configured in closed loops along one or more outer surfaces of the backing frame. The magnets can include multiple parallel multiple rings configured in closed loops along one or more outer surfaces of the backing frame. A sputtering material can be sputtered off from the one or more sputtering targets when a plasma is produced by a DC or RF electrical field near the one or more sputtering surfaces. The plasma can form a closed loop along the one or more sputtering surfaces. The first substrate can be one that is pre-constructed with at least an organic light-emitting diode (OLED) device, a metal oxide (e.g. indium gallium zinc oxide, or "IGZO") thin film transistor (TFF), a transparent conductive oxide (TCO) layer, or a radio-frequency identification (RFID) device. The sputtering material(s) can encapsulate one or more electronic devices pre-fabricated on the first substrate. The magnetron sputter deposition source can further include a housing unit which holds the backing frame, the one or more magnets, and the one or more sputtering targets. The deposition system can further include a vacuum process chamber that houses the magnetron sputter deposition source and the first substrate. The deposition system can further include a center electrode positioned in the window defined in the backing frame, wherein the center electrode can include an outer surface and orifices in the outer surface, wherein the orifices are configured to discharge a process gas. The gas can be dispersed in a gap between the outer surface of the center electrode and the inside surfaces of the backing frame. The center electrode can further include gas distribution channels configured to flow the process gas to the orifices. The center electrode can further include cooling channels configured to allow a coolant fluid to flow there through.

These and other aspects, their implementations and other features are described in details in the drawings, the description and the claims.

BRIEF DESCRIPTION OF THE DRAWINGS

FIG. 4C is a perspective view of the deposition source in FIG. 4B without the backing frame.

DETAILED DESCRIPTION OF THE INVENTION

Figure 1:
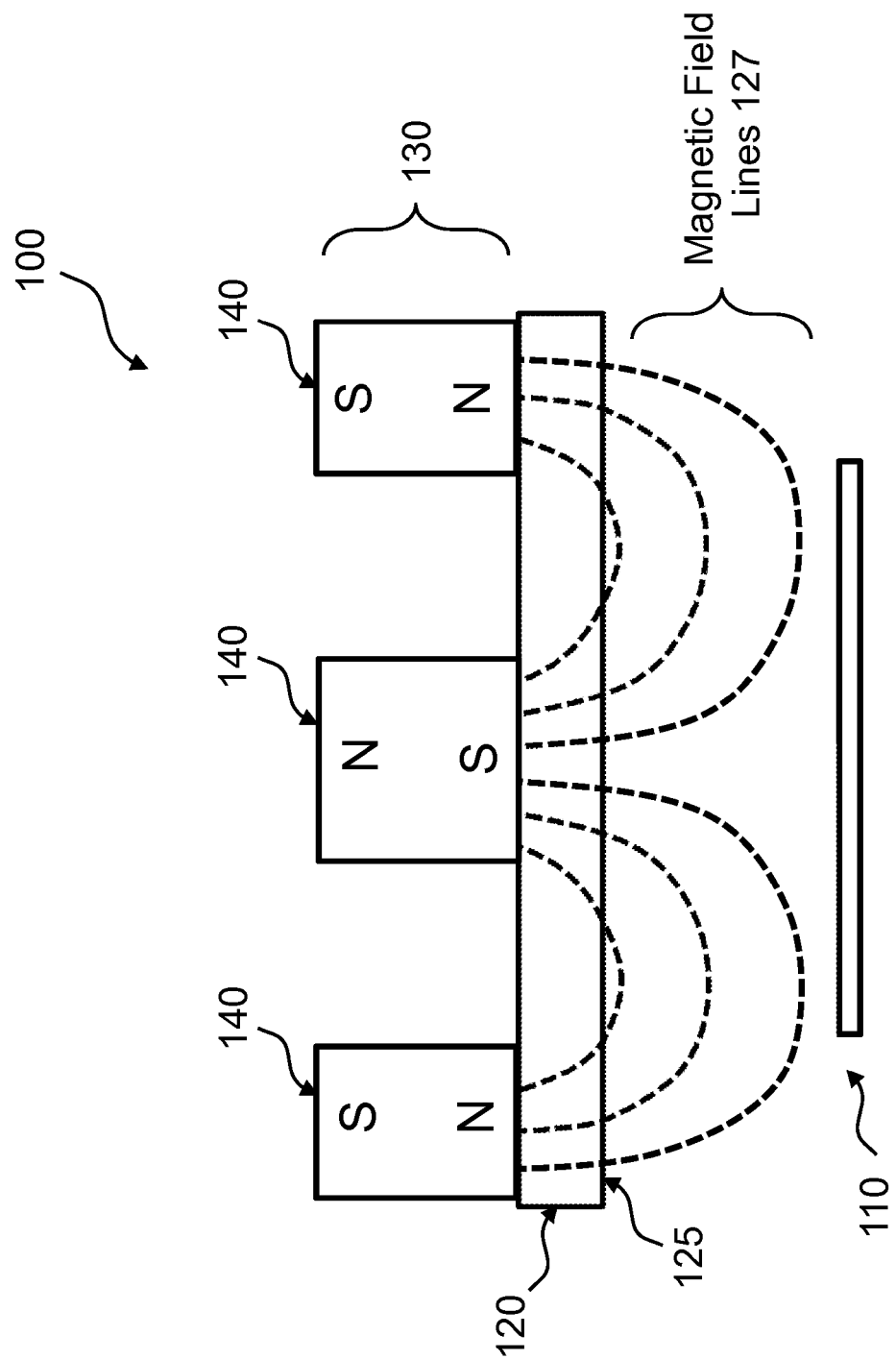
FIG. 1 shows a conventional sputter deposition system.
Figure 2:
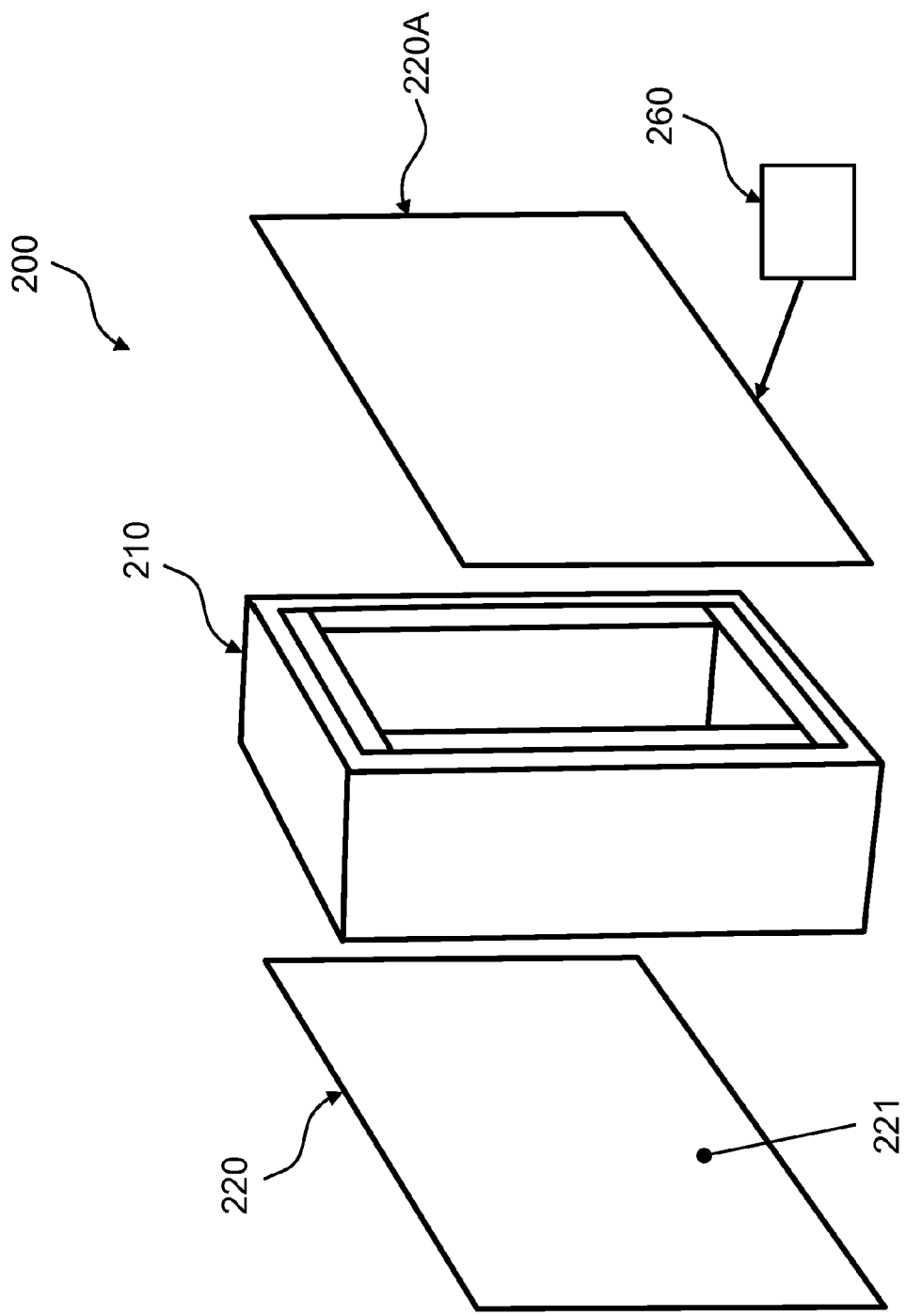
FIG. 2 is a perspective view of a deposition apparatus in accordance with the present invention.
Figure 3:
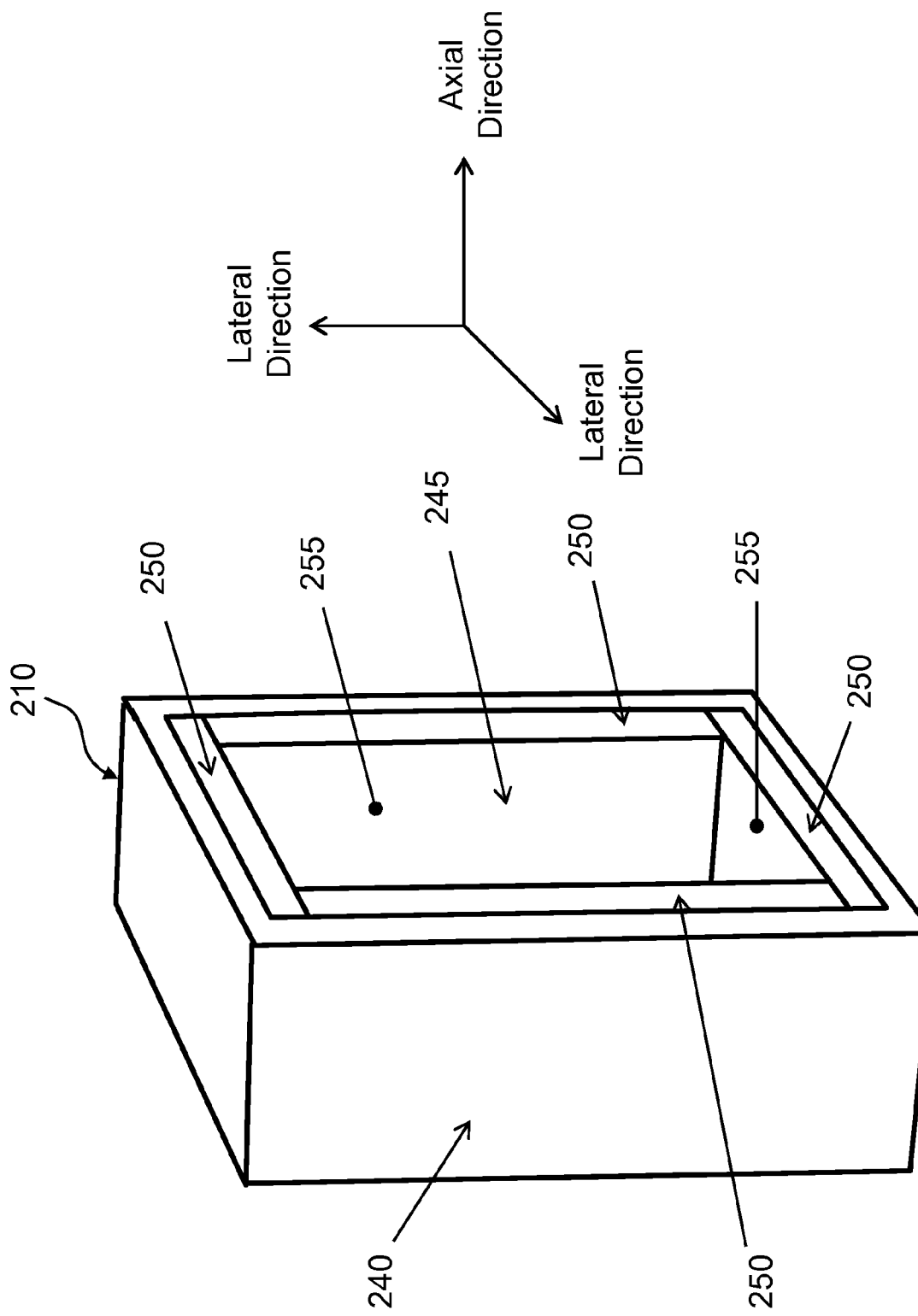
FIG. 3 is a perspective view of a deposition source compatible with the deposition apparatus of FIG. 2.

Referring to FIGS. 2-3, a deposition apparatus 200 includes a magnetron sputter deposition source 210 that is positioned between substrates 220, 220A (i.e. work pieces). The magnetron sputter deposition source 210 is configured to produce vaporized materials that are directed to and deposited onto the substrates 220, 220A. The magnetron sputter deposition source 210 and the substrates 220 are enclosed in a vacuum chamber (not shown for simplicity). The magnetron sputter deposition source 210 is constructed in a backing frame 240 that forms a window 245. Sputtering targets 250 are mounted on the inner surfaces of the backing frame 240, which defines the window 245. In one implementation, the backing frame 240 can be rectangular in shape. The sputtering targets 250 have sputtering surfaces 255 that are aligned substantially perpendicular to the deposition surfaces 221 of the substrates 220, 220A. Thus the window 245 is aligned along an axial direction that is substantially perpendicular to the deposition surfaces 221 of the substrates 220, 220A. The edges of the sputtering targets 250 (or the rims at the ends of the window 245) are parallel to the deposition surfaces 221.

The sputtering targets can be bonded or bolted to the inner surfaces of the backing frame 240 such that the sputtering surfaces 255 face inwards to define internal walls of the window 245. The sputtering targets are also electrically connected to the backing frame 240. Magnets can be mounted on the outside surfaces of the backing frame 240 to produce magnetic field near the sputtering surfaces 255. The magnets facilitate a desired magnetic field to confine plasma in a closed loop around the sputtering surfaces 255 of the sputtering targets 250 in the backing frame 240. Unlike conventional magnetron sputter source, the substrates 220, 220A are not directly exposed to or facing the target surfaces and are positioned away from the magnetic field near the sputtering surfaces 255.

One or more substrates 220, 220A are placed substantially perpendicular to the target surfaces and are parallel to a plane spanned by the backing frame 240. During thin film deposition, the substrates 220, 220A can remain stationary relative to the magnetron sputter deposition source 210, or can be transported by a transport mechanism 260 relative to the magnetron sputter deposition source 210. The substrates 220, 220A can be placed on one or two sides of the magnetron sputter deposition source 210. If positioned on two sides of the magnetron sputter deposition source 210, the materials sputtered off the sputtering surfaces 255 are collected on each of the two sides of the magnetron sputter deposition source 210, hence doubling collection efficiency and processing throughput in comparison with single-sided deposition.

The sputtering targets 250 and their associated sputtering surfaces 255 form a closed loop as defined by the backing frame 240 of the magnetron sputter deposition source 210. A plasma is produced by DC or RF electric excitations, and is confined by the magnetic field near the sputtering surfaces 255. The plasma remains confined in a closed loop within the backing frame 240 of the magnetron sputter deposition source 210. Since the plasma is mostly inside the backing frame 240 and is not projected toward the substrates 220, 220A, the probability for energetic ions or fast electrons to reach the surfaces of the substrates 220, 220A is substantially reduced. Damages to thin films or devices already formed on the substrates 220, 220A are prevented or drastically reduced.

The disclosed deposition source is compatible with different shapes and configurations. In some embodiments, referring to FIGS. 4, 4A-4C, a deposition apparatus 400 includes a magnetron sputter deposition source 410 that can be positioned between substrates 420, 420A. The magnetron sputter deposition source 410 and the substrates 420, 420A are enclosed in a vacuum chamber 405. The deposition apparatus 400 includes a vacuum turbo molecular pump 406 for exhausting air or gas from the vacuum chamber 405, an optional vacuum port 408 for connecting either to a roughing vacuum pump or to a venting valve, and a load lock chamber 407 for loading and unloading substrates 420, 420A (or wafers, or work pieces) in and out of the vacuum chamber 405. The magnetron sputter deposition source 410 includes a backing frame 460, sputtering targets 450 mounted on the backing frame 460, and magnets 470 mounted behind the backing frame 460. The sputtering targets 450 can be mounted on the backing frame 460 for example by bonding or bolting. The backing frame 460, the magnets 470, and the sputtering targets 450 are held in a housing unit 440 which can be implemented as a unitary component or by several members.

Figure 4:
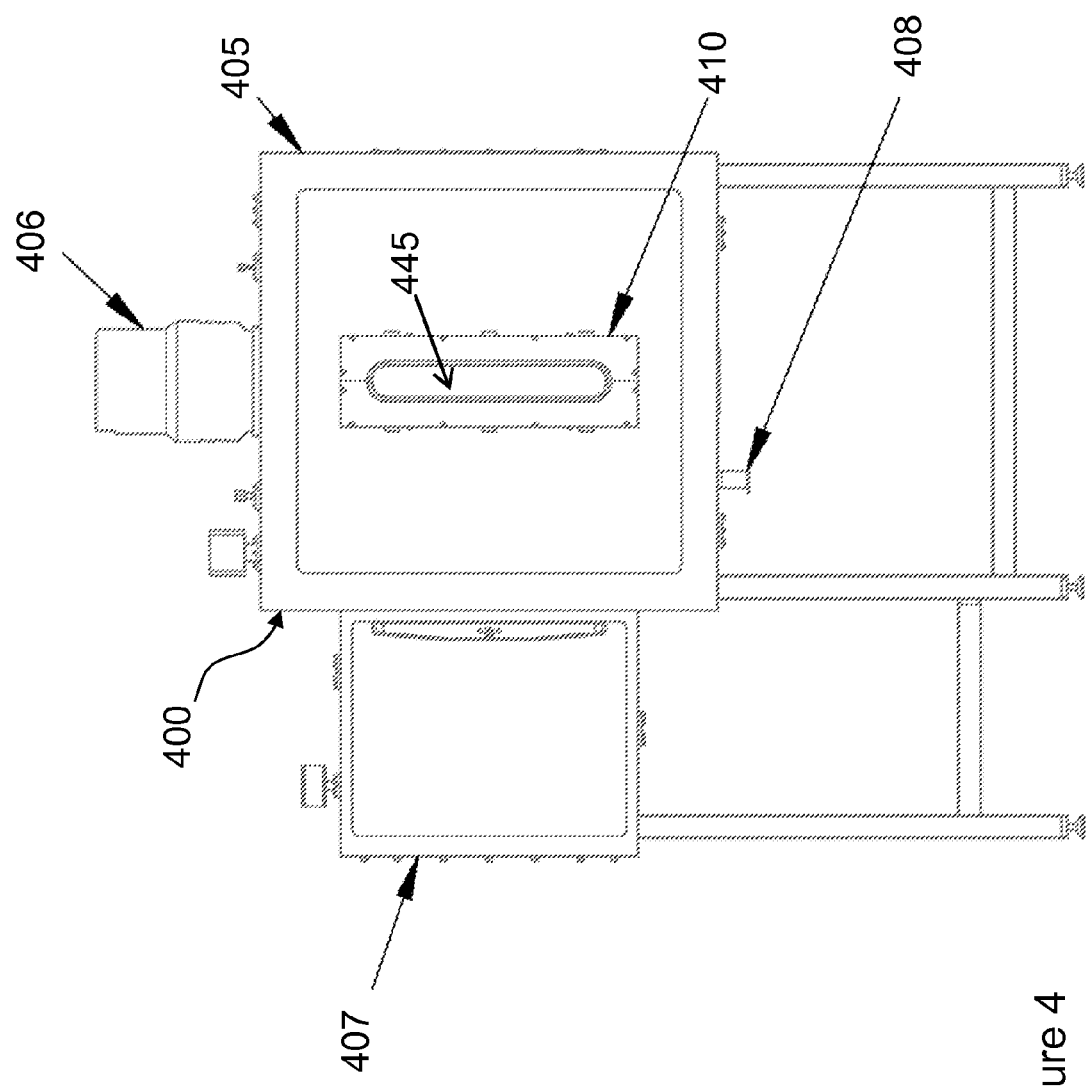
FIG. 4 is a side view of another deposition apparatus in accordance with the present invention.
Figure 4A:
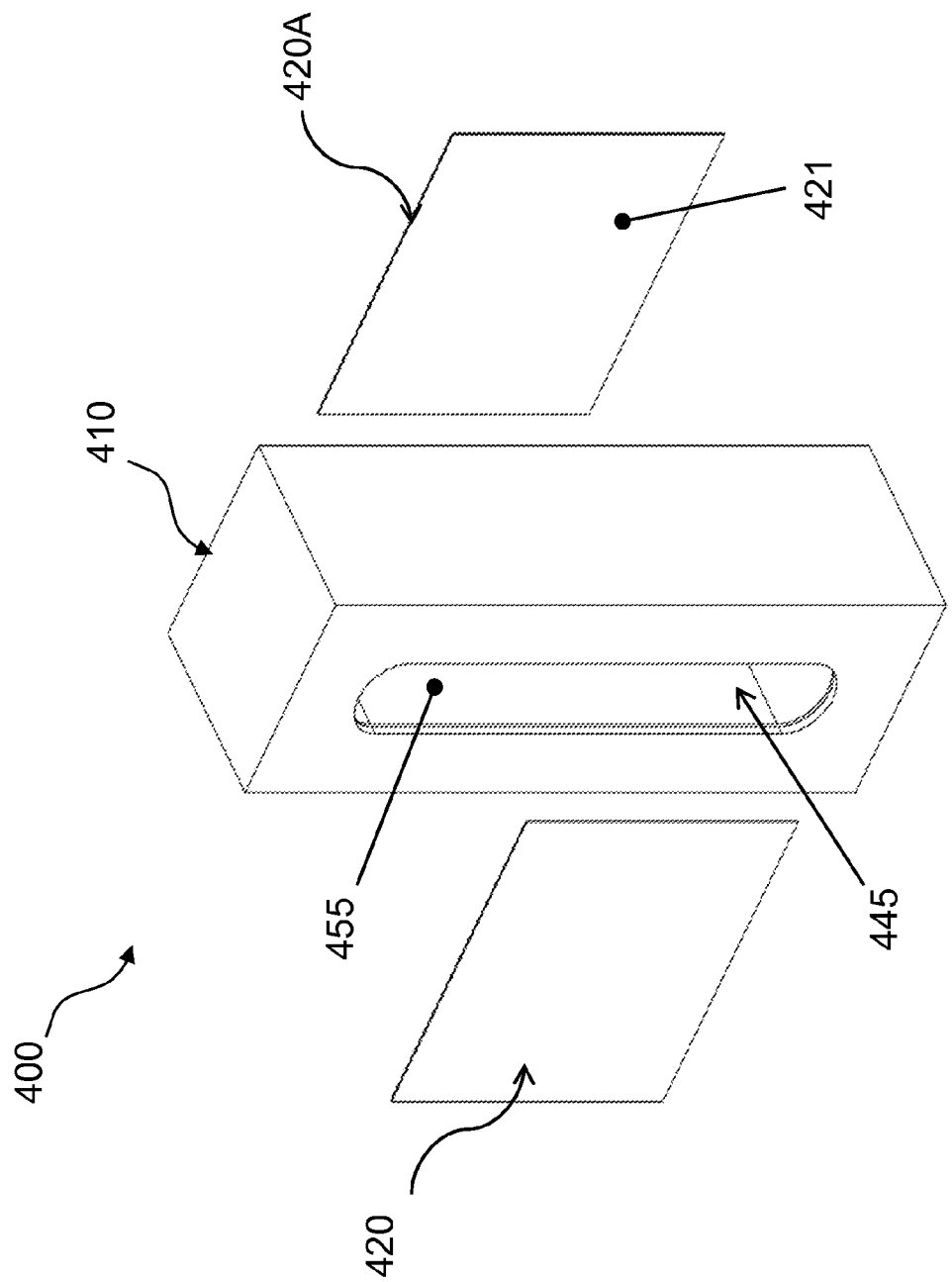
FIGS. 4A and 4B are perspective views of the deposition source and substrate in the deposition apparatus of FIG. 4 in accordance to some embodiments of the present invention.
Figure 4B:
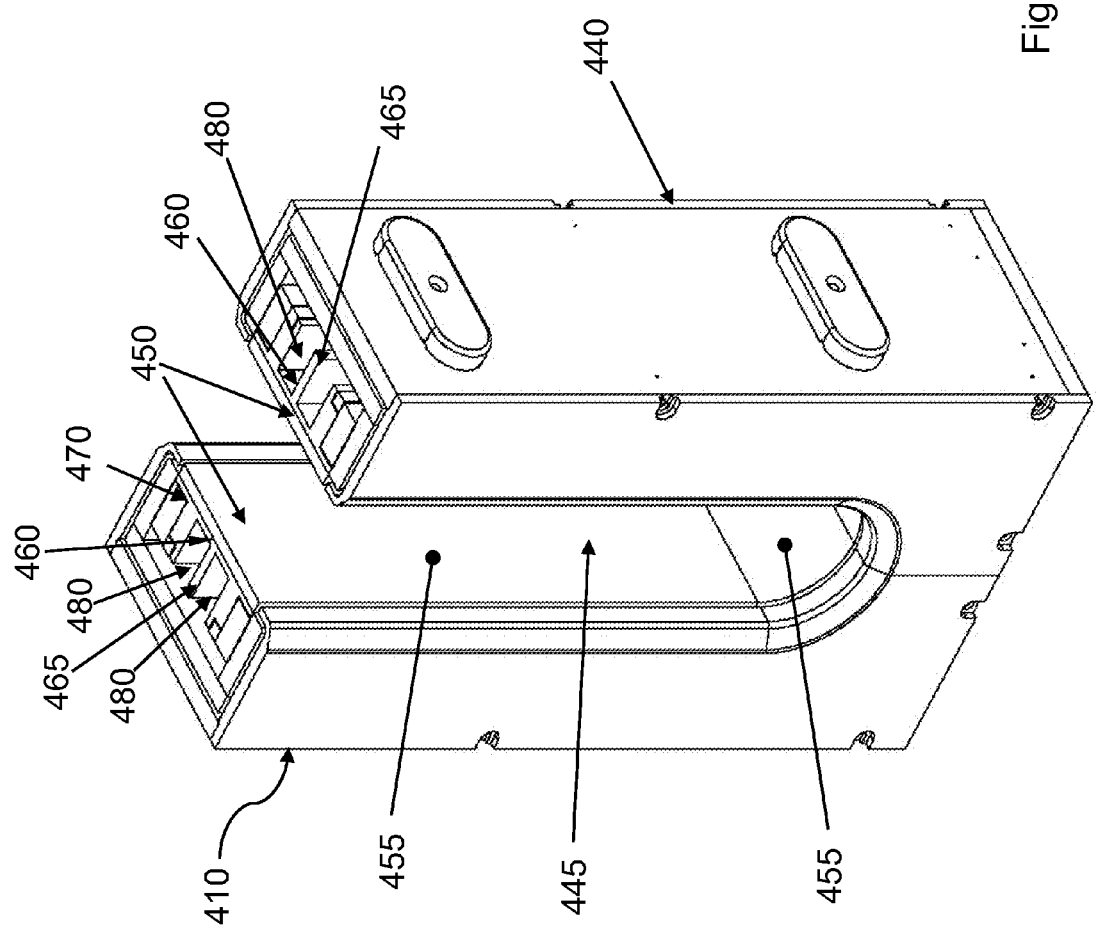

In some embodiments, referring to FIGS. 4B and 4C, the backing frame 460 includes ribs 465 along its outer surface with the magnets 470 being held along these ribs 465. The magnets can form closed loops long the outer surface of the backing frame 460. In some embodiments, referring to FIG. 7, the magnets 470 themselves are implemented as multiple parallel rings that form closed loops along the outer surfaces of the backing frame 460.

The backing frame 460 and the sputtering targets 450 mounted on the backing frame 460 respectively form a closed loop in the housing unit 440. The sputtering surfaces 455 of the sputtering targets 450 are oriented facing inward in the backing frame 460 and inside the housing unit 440. The sputtering surfaces 455 are substantially perpendicular to the deposition surfaces 421 of the substrates 420, 420A. The sputtering surfaces 455 together also define a window 445 in the magnetron sputter deposition source 410. The rim along each end of the window 445 defines a plane that is parallel to the deposition surfaces 421 of the substrate 420 or 420A.

The sputtering targets 450 are electrically connected to the backing frame 460, but are electrically insulated from the housing unit 440. The magnets 470 can produce magnetic field near the sputtering surfaces 455. The magnets 470 facilitate desired magnetic field to confine plasma in a closed loop around the sputtering surfaces 455 of the sputtering targets 450 in the backing frame 460. Unlike conventional magnetron sputter sources, the deposition surfaces 421 of the substrates 420, 420A in the disclosed system are not directly facing, but are substantially perpendicular to the sputtering surfaces 455. Thus the magnetic field near the sputtering surfaces 455 is not directed toward the deposition surfaces 421.

The sputtering targets 450 are also in thermal communication with the backing frame 460. In some embodiments, referring to FIGS. 4B and 4C, the backing frame 460 can be constructed with cooling channels 480 for flowing coolant to carry away heat generated during sputtering and deposition. In one implementation, water is used as coolant to flow through the cooling channels 480 to carry heat away from the backing frame 460 and the sputtering targets 450, and then exchange heat with a heat sink, a heat exchanger, or just with ambient air. Temperature of the sputtering targets 450 can thus be controlled to ensure proper processing conditions.

In some embodiments, the substrates 420, 420A and the sputter deposition source 410 can remain stationary relative to each other during thin film deposition. In some embodiments, the substrates 420, 420A and the magnetron sputter deposition source 410 can be moved relative to each other by moving at least one of them. The substrates 420, 420A can be placed on one or two sides of the magnetron sputter deposition source 410. If arranged on both sides, the materials sputtered off the sputtering surfaces 455 are utilized for deposition on both sides of the magnetron sputter deposition source 410, hence doubling collection efficiency and processing throughput in comparison with single-sided deposition. Since the plasma is effectively confined within the magnetron sputter deposition source 410, the probability for energetic ions or fast electrons to reach the deposition surfaces 421 of the substrates 420, 420A is substantially reduced.

Devices and depositions materials suitable for the disclosed deposition apparatus include OLED devices, metal oxide (e.g. indium gallium zinc oxide, or "IGZO") thin film transistors (TFFs), transparent conductive oxide (TCO) layer, and radio-frequency identification (RFID) devices. The sputtering or deposition materials can be used for encapsulating electronic devices (such as those described above) pre-fabricated on the substrate. Substrates that are compatible with the disclosed deposition apparatus include rigid (e.g. silicon wafers, glass panels) and flexible materials (e.g. stainless foils, polymer webs).

Figure 5A:
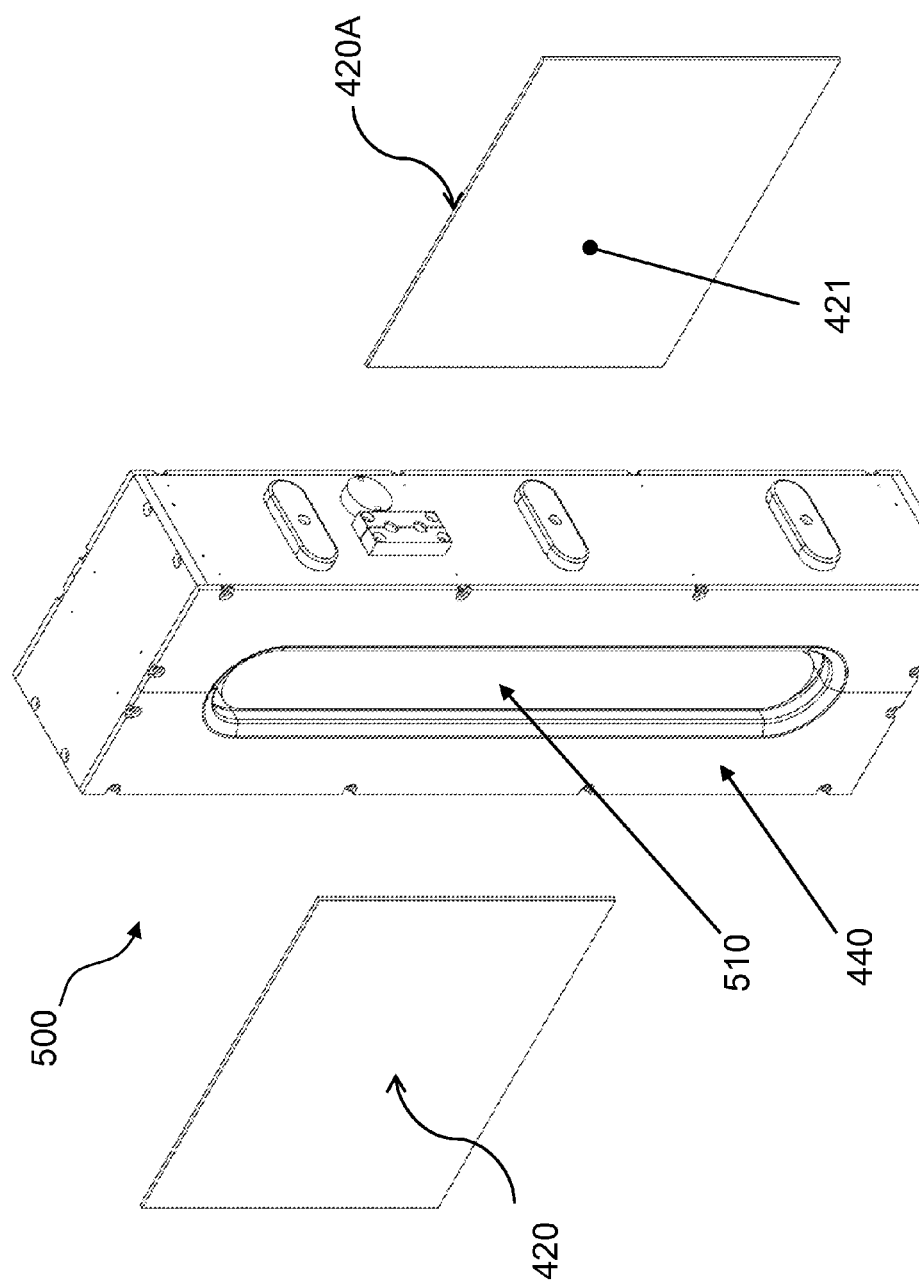
FIG. 5A is a perspective view of another deposition apparatus in accordance with the present invention.
Figure 5B:
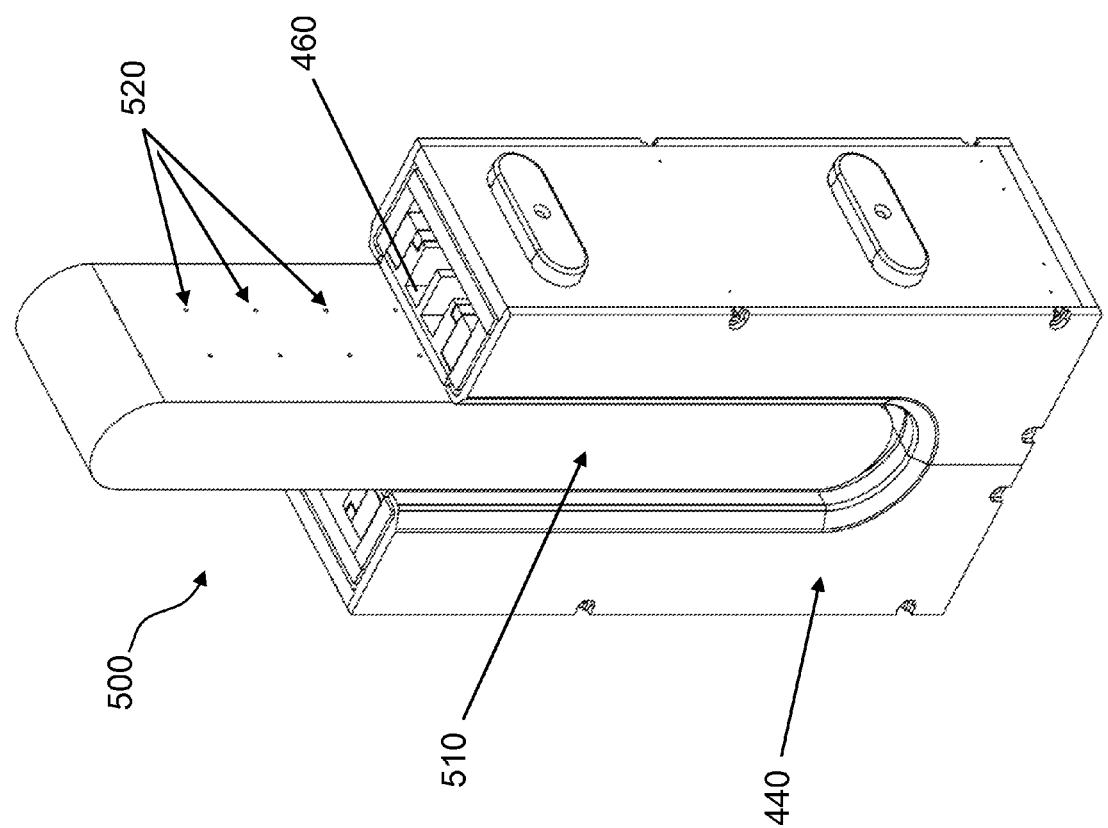
FIGS. 5B and 5C are perspective views of the linear ion source in FIG. 5A.
Figure 5C:
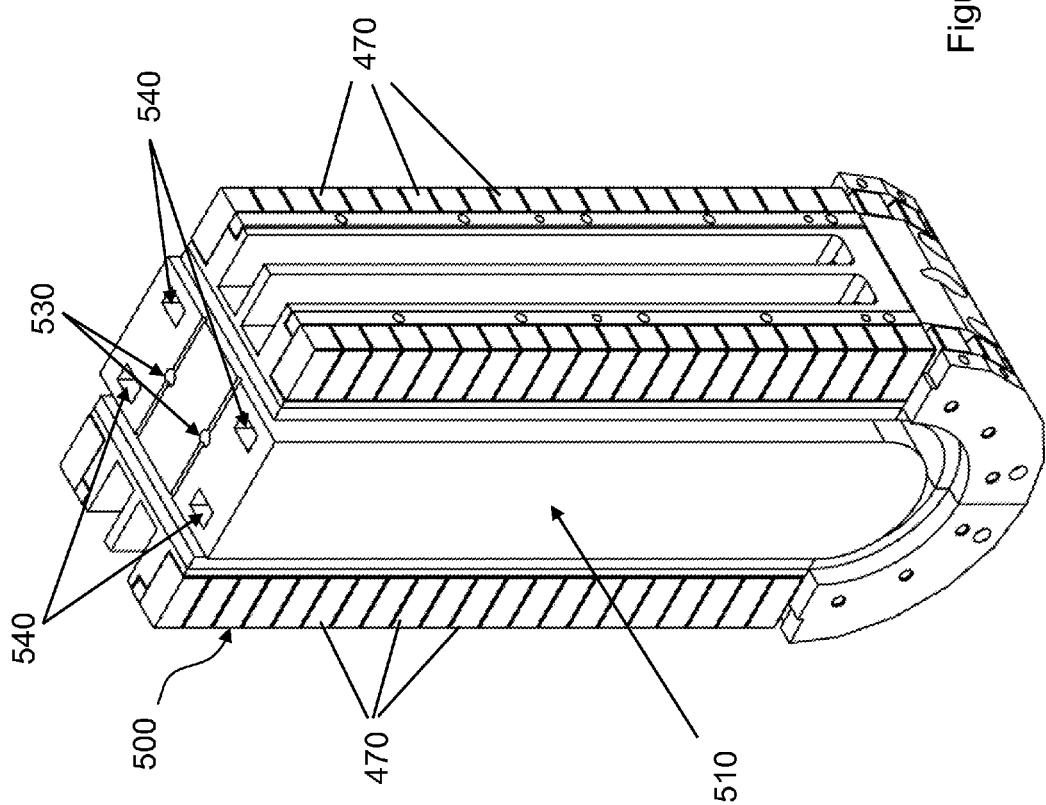

In some embodiments, a linear ion source 500 suitable for PECVD is shown in FIGS. 5A-5C. Similar to FIGS. 4B and 4C, the linear ion source 500 includes a backing frame 460 in a housing unit 440. The backing frame 460 defines a window 445 (not labeled in FIGS. 5A-5C) that is inserted with a center electrode 510. The center electrode 510 includes, on its outer surface, orifices 520 through which desired process gases can be discharged into the plasma region and become ionized between the backing frame 460 and the center electrode 510. Optionally, the sputtering targets 450 (shown in FIGS. 4B and 4C) are removed before the insertion of the central electrode 510 into the window to form the linear ion source 500.

As shown further in FIG. 5C, gas distribution channels 530 are embedded in the body of the center electrode 510 which are configured to feed process gas to the orifices 520 (shown in FIG. 5B) on the side surfaces of the center electrode 510. Moreover, the center electrode 510 includes cooling water channels 540, which can transport coolant for cooling the center electrode 510 that can be heated up by energetic bombarding ions during operation. The gap or spacing between the center electrode 510 and the surrounding electrode (i.e. the "sputtering targets" electrically and thermally connected to the backing frame 460 inside the housing unit 440) is configured to contain the plasma in the space within the gap. Further, the center electrode 510 can be electrically held at a potential that is same as or different from that of the backing frame 460 attached inside to the housing unit 440. Depending on the gases used to go through the gas injections orifices 520, the disclosed linear ion source 500 can be used as a source for PECVD on the substrates 420 and 420A positioned relative to the linear ion source 500 as exemplified in FIG. 5A. The disclosed linear ion source 500 can also be used for surface treatment of the substrate(s), which can be an integral part of the process for sputter deposition of thin films using the disclosed magnetron sputter deposition source (e.g. 410 shown in FIGS. 4A-4C).

Only a few examples and implementations are described. Other implementations, variations, modifications and enhancements to the described examples and implementations may be made without deviating from the spirit of the present invention. For example, the disclosed apparatus and system can be suitable for plasma assisted evaporation coating of metals, oxides, nitrides, polymers, where processing temperatures in the deposition apparatus can reach above 500° C. or even above 2000° C. to thousands of degrees Celsius (e.g. 3180° C.). The metals can include rhenium (melting point 3180° C.), copper (melting point 1080° C.), indium (melting point 156° C.), gallium (melting point 30° C.), or selenium (melting point 217° C.).

What is claimed is:
1. A deposition system, comprising:
   a magnetron sputter deposition source comprising:
      a backing frame that defines a window and a closed loop around an axial direction, wherein the backing frame includes inside surfaces towards the window and par- allel to the axial direction, wherein the backing frame includes outside surfaces opposite to the inside surfaces;

one or more sputtering targets mounted on the inside surfaces of the backing frame, wherein the one or more sputtering targets include one or more sputtering surfaces that define internal walls of the window, wherein the one or more sputtering surfaces are parallel to the axial direction; and one or more magnets mounted on the outside surfaces of the backing frame, wherein the one or more magnets are configured to produce a magnetic field near the one or more sputtering surfaces, wherein the one or more sputtering targets provide sputtering material(s) from the one or more sputtering surfaces, wherein the sputtering material(s) are to be deposited on a first deposition surface on a first substrate, wherein the first deposition surface is oriented towards the window in the backing frame.

2. The deposition system of claim 1, wherein the first deposition surface is substantially perpendicular to the axial direction and the one or more sputtering surfaces.

3. The deposition system of claim 1, further comprising: a transport mechanism configured to produce a relative movement between the first substrate and the magnetron sputter deposition source.

4. The deposition system of claim 1, wherein the sputtering material(s) are to be deposited on a second deposition surface on a second substrate, wherein the second substrate is positioned on an opposite side of the first substrate relative to the backing frame.

5. The deposition system of claim 4, wherein the second deposition surface is substantially perpendicular to the one or more sputtering surfaces.

6. The deposition system of claim 1, wherein the backing frame comprises one or more cooling channels configured to enable a coolant to flow through to carry heat away from the backing frame and the sputtering targets.

7. The deposition system of claim 1, wherein the backing frame include multiple ribs along one or more outer surfaces of the backing frame, wherein the ribs are configured to define one or more cooling channels in between the ribs, wherein the one or more cooling channels are configured to enable a coolant to flow through to carry heat away from the backing frame and the sputtering targets.

8. The deposition system of claim 1, wherein the backing frame include multiple ribs along one or more outer surfaces of the backing frame, wherein the ribs are configured to hold the one or more magnets along the ribs.

9. The deposition system of claim 1, wherein the magnets include one or more rings configured in closed loops along one or more outer surfaces of the backing frame.

10. The deposition system of claim 9, wherein the magnets include multiple parallel multiple rings configured in closed loops along one or more outer surfaces of the backing frame.

11. The deposition system of claim 1, wherein a sputtering material is sputtered off from the one or more sputtering targets when a plasma is produced by a DC or RF electrical field near the one or more sputtering surfaces.

12. The deposition system of claim 11, wherein the plasma forms a closed loop along the one or more sputtering surfaces.

13. The deposition system of claim 1, further comprising: a center electrode positioned in the window defined in the backing frame, wherein the center electrode comprises an outer surface and orifices in the outer surface, wherein the orifices are configured to discharge a process gas.

14. The deposition system of claim 13, wherein the gas is dispersed in a gap between the outer surface of the center electrode and the inside surfaces of the backing frame.

15. The deposition system of claim 1, wherein the center electrode further comprises gas distribution channels configured to flow the process gas to the orifices.

16. The deposition system of claim 1, wherein the center electrode further comprises cooling channels configured to allow a coolant fluid to flow there through.

17. The deposition system of claim 1, wherein the first substrate is pre-fabricated with at least a part of an organic light-emitting diode (OLED) device, an indium gallium zinc oxide (IGZO) based display device, a metal oxide thin film transistor (TFF), a transparent conductive oxide (TCO) layer, or a radio-frequency identification (RFID) device.

18. The deposition system of claim 1, wherein the sputtering material(s) are deposited to encapsulate one or more electronic devices pre-constructed on the first substrate.

19. The deposition system of claim 1, wherein the magnetron sputter deposition source further comprises: a housing unit which holds the backing frame, the one or more magnets, and the one or more sputtering targets.

20. The deposition system of claim 1, further comprising: a vacuum process chamber that houses the magnetron sputter deposition source and the first substrate.

* * * * *